(12) United States Patent
Bian et al.

(10) Patent No.: US 10,910,503 B1
(45) Date of Patent: Feb. 2, 2021

(54) SEMICONDUCTOR DETECTORS WITH BUTT-END COUPLED WAVEGUIDE AND METHOD OF FORMING THE SAME

(71) Applicant: GLOBALFOUNDRIES INC., Grand Cayman (KY)

(72) Inventors: Yusheng Bian, Ballston Lake, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/544,866

(22) Filed: Aug. 19, 2019

(51) Int. Cl.
*H01L 31/0352* (2006.01)
*H01L 31/0232* (2014.01)
*G02B 6/13* (2006.01)
*G02B 6/12* (2006.01)

(52) U.S. Cl.
CPC .... *H01L 31/02327* (2013.01); *G02B 6/12004* (2013.01); *G02B 6/13* (2013.01); *G02B 2006/12085* (2013.01)

(58) Field of Classification Search
CPC ......... H01L 31/0352; H01L 31/035272; H01L 31/035281
See application file for complete search history.

(56) References Cited

U.S. PATENT DOCUMENTS

| | | | |
|---|---|---|---|
| 7,616,904 B1 | 11/2009 | Gunn, III et al. | |
| 9,229,164 B2 | 1/2016 | Assefa et al. | |
| 9,356,164 B2 | 5/2016 | Assefa et al. | |
| 2012/0235265 A1* | 9/2012 | Takabayashi | H01L 31/105 257/432 |
| 2016/0155884 A1* | 6/2016 | Hon | H01L 31/103 250/200 |
| 2020/0124795 A1* | 4/2020 | Cherchi | G02B 6/1228 |

OTHER PUBLICATIONS

Quentin Wilmart et al., A Versatile Silicon-Silicon Nitride Photonics Platform for Enhanced Functionalities and Applications, Applied Sciences, 2019, 1-16, 9, 255, MDPI, Switzerland.
Solomon Assefa et al., CMOS-Integrated 40GHz Germanium Waveguide Photodetector for On-chip Optical Interconnects, OSA, 2009, 1-3, IEEE, US.
Donghwan Ahn et al., Evanescent Coupling Device Design for Waveguide-Integrated Group IV Photodetectors, Journal of Lightwave Technology, Dec. 1, 2010, 3387-3394, vol. 28, No. 23, IEEE.
Donghwan Ahn et al., High performance, waveguide integrated Ge photodetectors, Optics Express, Apr. 2, 2007, 3916-3921, vol. 15, No. 7, OSA, US.

(Continued)

*Primary Examiner* — Jae Lee
(74) *Attorney, Agent, or Firm* — David Cain

(57) ABSTRACT

The present disclosure generally relates to semiconductor detectors for use in optoelectronic/photonic devices and integrated circuit (IC) chips, and methods for forming same. The present disclosure also relates to photodetectors integrated with waveguide stacks, more particularly, photodetectors with butt-end coupled waveguides. The present disclosure also relates to methods of forming such structures.

20 Claims, 19 Drawing Sheets

(56) References Cited

OTHER PUBLICATIONS

M. Elkurdi et al., Near-infrared waveguide photodetector with Ge/Si self-assembled quantum dots, Applied Physics Letters, Jan. 21, 2002, 509-511, vol. 80, No. 3, American Institute of Physics, US.

Kyle Preston et al., Waveguide-integrated telecom-wavelength photodiode in deposited silicon, Optics Letters, Jan. 1, 2011, 52-54, vol. 36, No. 1, Optical Society of America, US.

H. Chen et al.,—1 V bias 67 GHz bandwidth Si-contacted germanium waveguide p—i—n photodetector for optical links at 56 Gbps and beyond, Optics Express, Feb. 24, 2016, 1-10, vol. 24, No. 5, OSA, US.

\* cited by examiner

SEMICONDUCTOR DETECTORS WITH BUTT-END COUPLED WAVEGUIDE AND METHOD OF FORMING THE SAME

FIELD OF THE INVENTION

The present disclosure generally relates to semiconductor detectors for use in optoelectronic/photonic devices and integrated circuit (IC) chips, and methods for forming same. The present disclosure also relates to photodetectors integrated with waveguide stacks, more particularly, photodetectors with butt-end coupled waveguides. The present disclosure also relates to methods of forming such structures.

BACKGROUND

Semiconductor detectors, such as photodetectors, are sensors that detect light or other electromagnetic energy and may typically be found in optoelectronic or photonic devices that are manufactured using semiconductor processes. The use of such devices in high-speed switching and transceiver devices in data communications are but a few examples that highlight the advantages of processing both optical and electrical signals within a single integrated circuit (IC) device.

An integrated photonic device may include both photodetector and waveguide (e.g., an optical waveguide) fabricated on a single substrate. The waveguide serves as a channel to guide electromagnetic waves into the photodetector by confining the waves to propagate in one dimension in order to minimize loss of energy or power. Ideally, it is desirable to have the waveguide and photodetector sections achieve a coupling efficiency for the electromagnetic waves as close as possible to 100 percent for both transverse-electric (TE) and transverse-magnetic (TM) polarized modes. However, in practice, the coupling efficiency between the waveguide and photodetector sections is lower due to mismatches in the mode profiles and mode indices during optical transmission of electromagnetic waves, which limits the performance of photodetector (e.g., loss of energy/power in the photodetector).

Therefore, there is a need to provide semiconductor devices and methods of forming the same that can overcome, or at least ameliorate, one or more of the disadvantages as described above.

SUMMARY

In an aspect of the present disclosure, there is provided a semiconductor device having a substrate, a semiconductor layer having a waveguide section and an adjoining active section above the substrate, a semiconductor detector disposed on the active section of the semiconductor layer, a dielectric layer disposed over the semiconductor detector, and a waveguide structure above the waveguide section of the semiconductor layer and adjacent to the semiconductor detector.

In another aspect of the present disclosure, there is provided a semiconductor device having a substrate, a semiconductor layer having a waveguide section and an adjoining active section above the substrate, a semiconductor detector disposed on the active section of the semiconductor layer, a dielectric layer disposed over the semiconductor detector and a plurality of waveguide structures that are vertically stacked above the waveguide section of the semiconductor layer and adjacent to the semiconductor detector.

In yet another aspect of the present disclosure, there is provided a method of forming a semiconductor device by providing a semiconductor layer above a substrate, patterning the semiconductor layer to form a waveguide section and an adjoining active section, forming a semiconductor detector on the active section, forming a dielectric layer over and covering the semiconductor detector, and forming a waveguide structure above the waveguide section of the semiconductor layer, where the waveguide structure is formed adjacent to the semiconductor detector.

Advantageously, the present disclosure is found to provide a higher modal effective index of the device and an improved effective index match between the waveguides and the semiconductor detector. Additionally, the configuration of the present structure is found to provide an increased modal overlap and therefore achieving significantly enhanced coupling efficiency between the waveguides and the semiconductor detector for electromagnetic waves transmitting in both TE and TM modes.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIGS. 5D' to 5G' are cross-sectional views and illustrate another example of various processing stages for forming a semiconductor device, in accordance with embodiments of the present disclosure. FIG. 5D' continues from the embodiment shown in FIG. 5C.

DETAILED DESCRIPTION

Figure 1A:
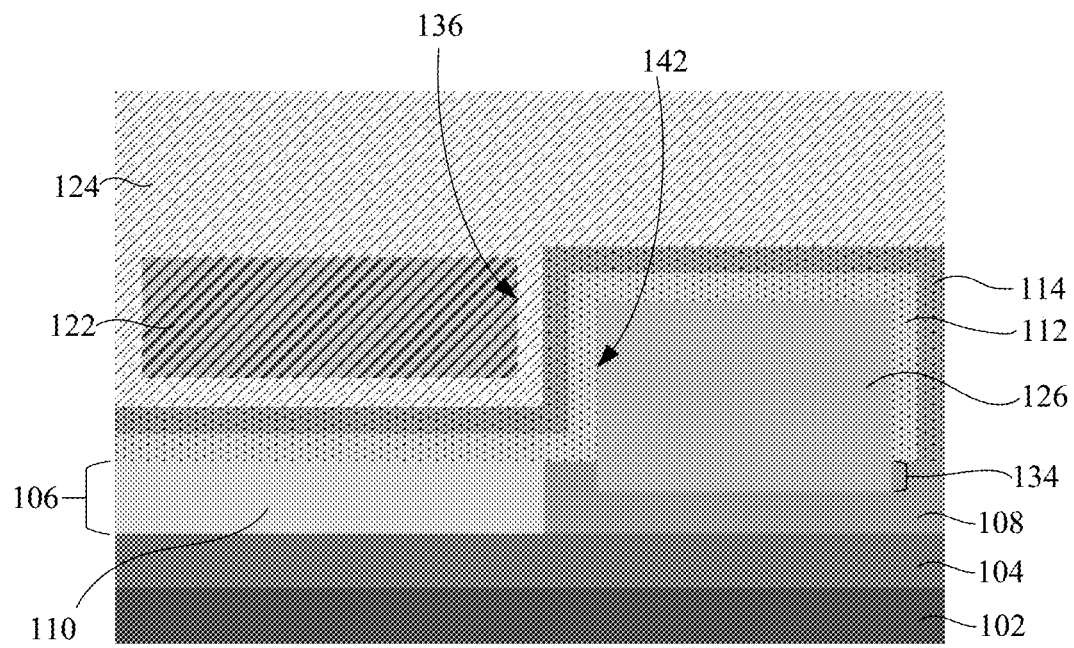
FIGS. 1A to 1F are cross-sectional views of exemplary semiconductor devices having a waveguide structure and a semiconductor detector, in accordance with embodiments of the present disclosure.

Various illustrative embodiments of the present disclosure are described below. The embodiments disclosed herein are exemplary and not intended to be exhaustive or limiting to the present disclosure.

FIGS. 1A to 1F depict exemplary semiconductor devices in accordance with embodiments of the present disclosure. As shown, the semiconductor devices include a substrate 102, and a semiconductor layer 106 disposed above the substrate 102. A buried insulator layer 104 (e.g., an oxide layer) may be disposed in between the semiconductor layer 106 and the substrate 102. The semiconductor layer 106 has a waveguide section 110 and an adjoining active section 108. A semiconductor detector 126 is disposed on the active section 108 of the semiconductor layer 106 and a waveguide structure 122 is disposed above the waveguide section 110 of the semiconductor layer 106. A dielectric layer 114 is disposed over the semiconductor detector 126. The embodiment shown in FIG. 1A may be preferred to the embodiments shown in FIGS. 1B to 1F.

The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe.

The substrate 102 may be a semiconductor-on-insulator substrate or a bulk semiconductor substrate. Examples of a semiconductor-on-insulator substrate may include, but not limited to, an organic semiconductor or a layered semiconductor, such as Si/SiGe, a silicon-on-insulator (SOI), a germanium-on-insulator (GOI), or a SiGe-on-insulator. A portion or the entire semiconductor substrate 102 may be amorphous, polycrystalline, or monocrystalline.

The semiconductor layer 106 may be made of any semiconductor material, such as silicon, germanium, silicon germanium (SiGe), silicon carbide, and those consisting essentially of III-V compound semiconductors, such as GaAs, II-VI compound semiconductors such as ZnSe. A portion or the entire semiconductor layer 106 may be amorphous, polycrystalline, or monocrystalline.

The active section 108 of the semiconductor layer 106 may function as an electrical pathway for current flow. Although not shown in the accompanying drawings, the active section 108 may include doped regions. Electrical contacts (not shown) may be formed above doped regions to provide electrical interconnections to other device components in an IC.

Figure 1B:
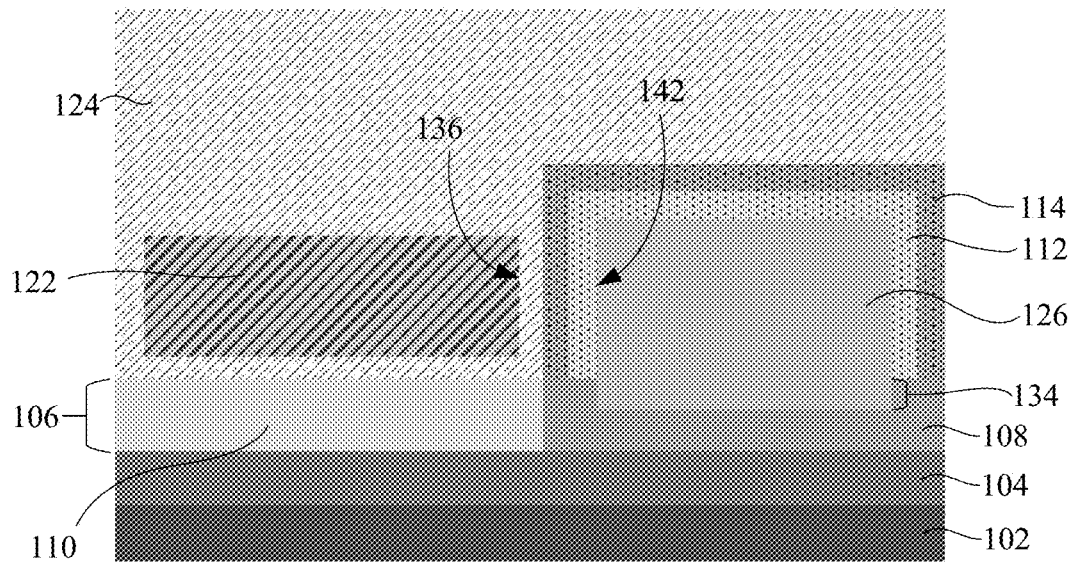
Figure 1C:
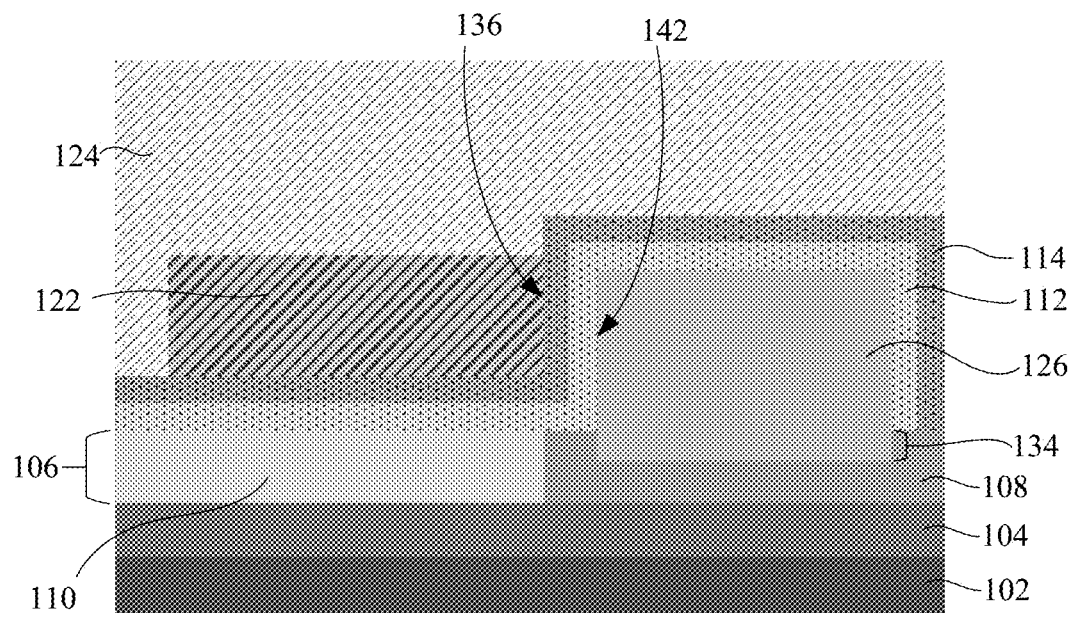
Figure 1D:
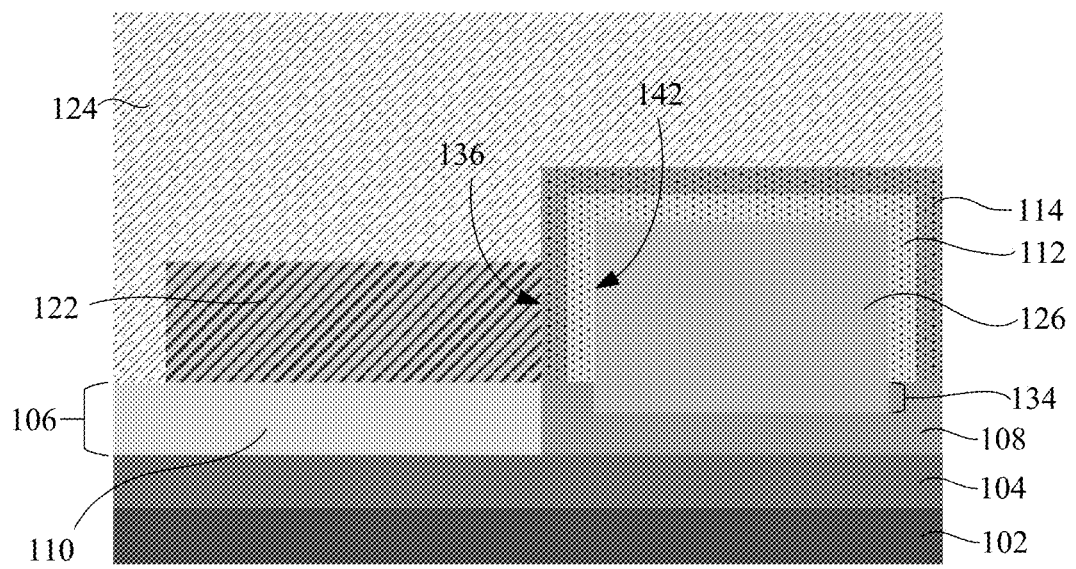

The semiconductor detector 126 may include germanium containing compounds and may have a thickness in the range of about 150 nm to about 1000 nm. In some embodiments, the germanium containing compound is germanium only or SiGe. As shown in FIGS. 1A to 1E, the semiconductor detector 126 is disposed in a recessed portion 134 of the active section 108 of the semiconductor layer 106. Alternatively, as shown in FIG. 1F, there is no recessed portion in the active section 108 and the semiconductor detector 126 is disposed on a planar top surface of the active section 108 of the semiconductor layer 106. Although not shown in the accompanying drawings, the semiconductor detector 126 may include doped regions and may function as an electrical pathway for current flow during operation of the device.

The waveguide section 110 of the semiconductor layer 106 functions as an optical waveguide for the propagation of electromagnetic waves (e.g., light waves) into the adjoining active section 108 of the semiconductor layer 106. The active section 108 is also optically coupled to the semiconductor detector 126, where the electromagnetic waves propagate from the underlying active section 108 to the overlying semiconductor detector 126 (i.e., an "evanescent coupling").

The waveguide structure 122 is adjacent to the semiconductor detector 126. In embodiments of the present disclosure, the semiconductor detector 126 has a front facet 142 facing an end facet 136 of the waveguide structure 122. The waveguide structure 122 includes either a semiconductor material or a dielectric material.

Examples of the semiconductor material in the waveguide structure 122 may include, but limited to, amorphous silicon, polycrystalline silicon, amorphous germanium, polycrystalline germanium, amorphous SiGe, or polycrystalline SiGe. Examples of the dielectric material in the waveguide structure 122 may include, but not limited to, silicon nitride (SiN), silicon oxynitride (SiON), aluminum nitride (AlN) or other nitride-containing compounds. In an embodiment, the waveguide structure 122 preferably includes a nitride-containing compound, in particular, silicon nitride.

The waveguide structure 122 may have width and thickness dimensions (i.e., boundary conditions) that are designed for confining a particular electromagnetic field pattern mode (for example, a transverse-magnetic mode) of the propagating electromagnetic waves within the waveguide structure 122. In particular, the thickness of the waveguide structure 122 may be determined based on the geometries and dimensions of the waveguide section 110 of the underlying semiconductor layer 106 as well as the semiconductor detector 126. The determination of the thickness of the waveguide structure 122 may control the optical coupling between the waveguide section 110 of the semiconductor layer 106 and the semiconductor detector 126. In some embodiments, the thickness of the waveguide structure 122 may be in a preferred range of about 100 nm to about 500 nm.

The dielectric layer 114 has a preferred thickness in the range of about 10 nm to about 76 nm. The dielectric layer 114 has a preferred refractive index in the range of about 1.7 to about 2.2. The dielectric layer 114 may include a dielectric material, such as silicon nitride, silicon oxynitride, or aluminum nitride. Advantageously, the dielectric layer 114 functions as a passivation layer to provide protection for the semiconductor detector 126 against chemical damage. More advantageously, the range of refractive indices for the dielectric layer 114 is found to enhance the optical coupling between the waveguide structure 122 and the semiconductor detector 126, for example, by confining the electromagnetic field pattern within the waveguide structures.

A dielectric liner 112 may be disposed on the semiconductor detector 126 and between the semiconductor detector 126 and the dielectric layer 114. The dielectric liner 112 may serve as an additional protective liner for the semiconductor detector 126 and has a thickness in the range of about 5 nm to about 30 nm. The dielectric liner 112 may include an oxide-containing dielectric material such as silicon dioxide, germanium oxide, SiGe oxide, silicon oxynitride (SiON), hafnium oxide ($HfO_2$), aluminum oxide ($Al_2O_3$), or zinc oxide (ZnO). The SiGe oxide has a chemical formula of $Si_{(1-x)}Ge_xO_y$, where x and y are in stoichiometric ratio. In some embodiments, the dielectric liner 112 has a refractive index in the range of about 1.4 to about 2, and preferably about 1.4 to about 1.7.

As shown in FIGS. 1A, 1B, 1C, 1D, and 1F, the dielectric layer 114 and the dielectric liner 112 is between and separates the end facet 136 of the waveguide structure 122 and the front facet 142 of the semiconductor detector 126.

Figure 1E:
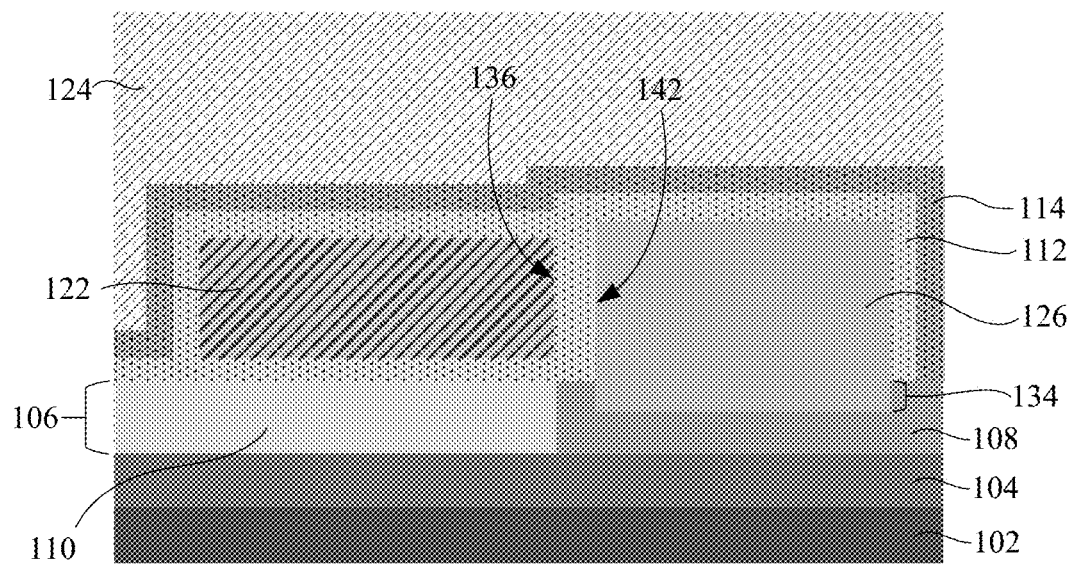
Figure 1F:
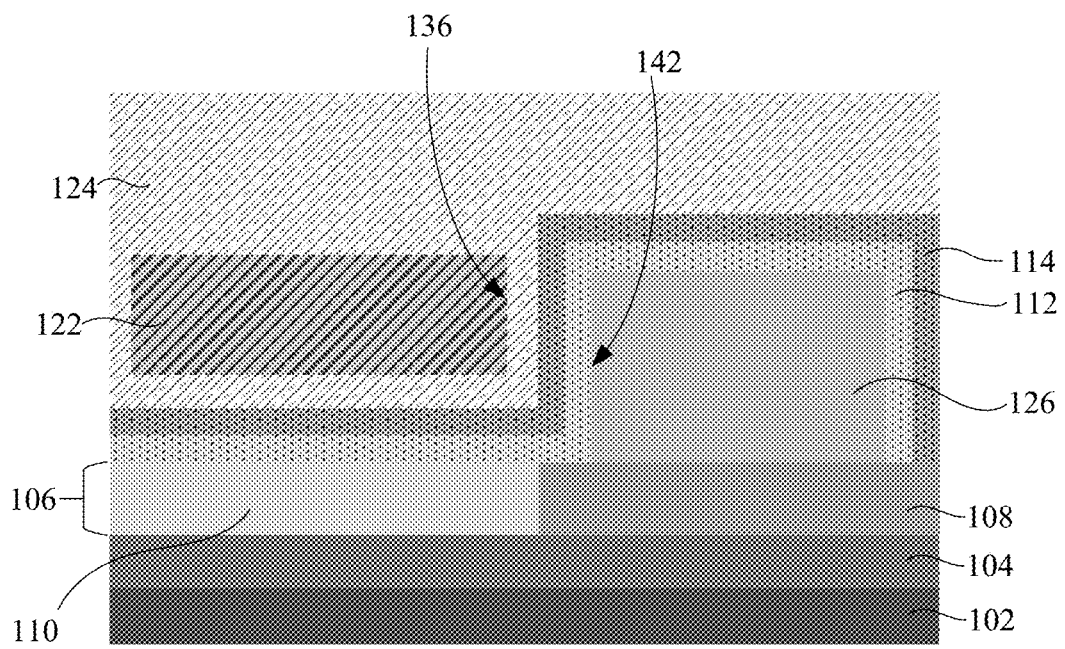

Alternatively, as shown in FIG. 1E, only the dielectric liner 112 is between the end facet 136 of the waveguide structure 122 and the front facet 142 of the semiconductor detector 126. Additionally, in FIG. 1E, the dielectric layer 114 is disposed over and covering both the semiconductor detector 126 and the waveguide structure 122.

In the embodiments shown in FIGS. 1A, 1C, 1E and 1F, the dielectric layer 114 and the dielectric liner 112 extend above the waveguide section 110 of the semiconductor layer 106. In the embodiment shown in FIG. 1E, the dielectric liner 112 encapsulates the waveguide structure 122.

Alternatively, in the embodiment shown in FIGS. 1B and 1D, the dielectric layer 114 and the dielectric liner 112 are disposed above the active section 108 of the semiconductor layer 106 only.

Advantageously, by configuring the dielectric liner 112 in between the waveguide section 110 of the semiconductor layer 106 and the waveguide structure 122, it is found that such a configuration can provide increased confinement of the optical modes, especially for the transverse-magnetic (TM) mode.

The semiconductor devices described herein may further include a cladding structure 124 disposed above and covering the waveguide structure 122 and the dielectric layer 114. The cladding structure 124 may function as an interlayer dielectric to provide electrical insulation from other device components in an IC. The cladding structure 124 may include multiple dielectric cladding layers. For example, the cladding structure 124 includes multiple layers of silicon oxide.

As shown in FIGS. 1A, 1B, and 1F, the waveguide structure 122 is embedded within the cladding structure 124. As shown in FIG. 1C, the waveguide structure 122 is disposed directly on the dielectric layer 114.

Alternatively, as shown in FIG. 1D, the waveguide structure 122 is disposed directly on the waveguide section 110 of the semiconductor layer 106 and the end facet 136 of the waveguide structure 122 is directly adjacent to the dielectric layer 114.

As noted above, FIG. 1F shows an embodiment having no recessed portion in the active section 108 and the semiconductor detector 126 is disposed on a planar top surface of the active section 108 of the semiconductor layer 106. This modification will similarly apply to the embodiment shown in FIGS. 1B through 1E. This embodiment may offer the advantage of removing a processing step.

Figure 2A:
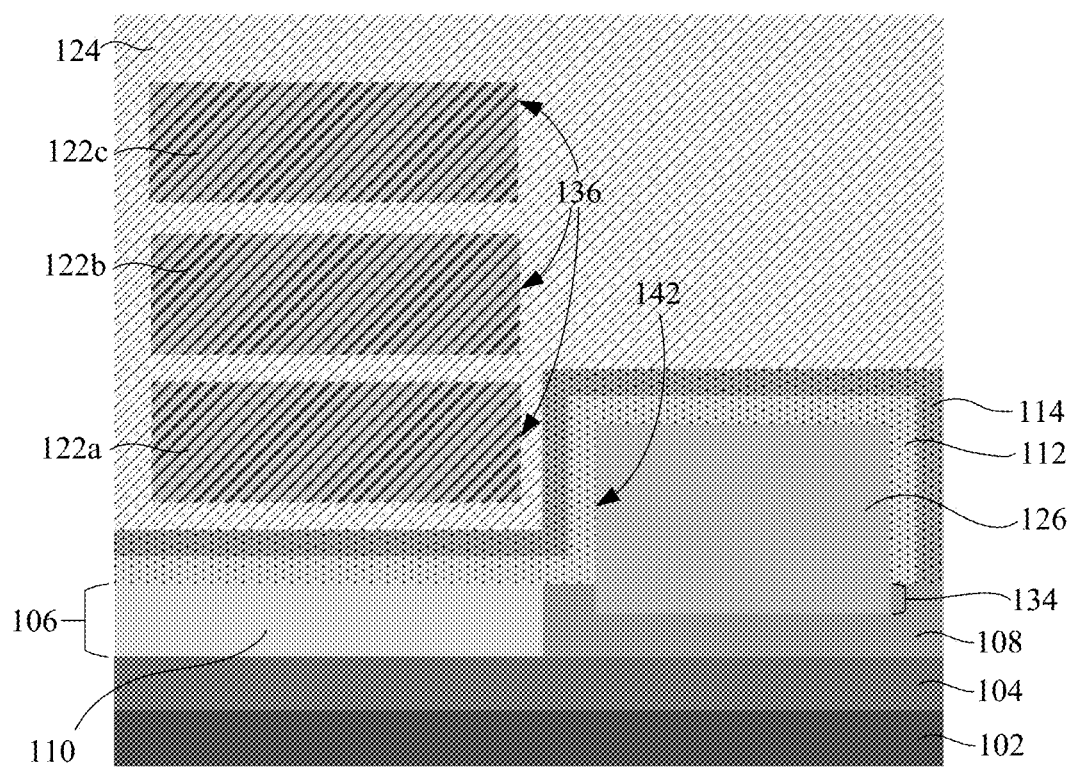
FIGS. 2A, 2A', 2B, and 2B' are cross-sectional views of exemplary semiconductor devices having vertically stacked waveguide structures and a semiconductor detector, in accordance with embodiments of the present disclosure.
Figure 2A:
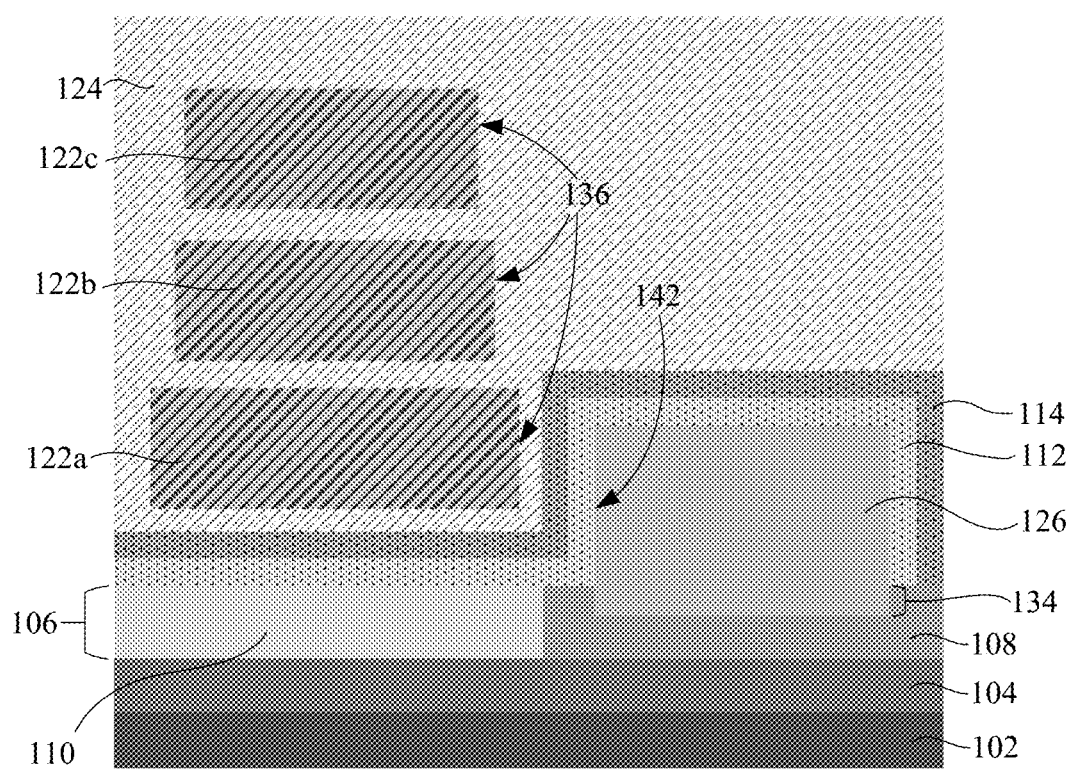

FIGS. 2A, 2A', 2B, and 2B' depict embodiments having a plurality of waveguide structures 122a, 122b, and 122c that are vertically stacked above the waveguide section 110 of the semiconductor layer 106, in accordance with the present disclosure.

Referring to FIG. 2A, additional waveguide structures 122b and 122c are formed above the embodiment shown in FIG. 1A. For example, a first waveguide structure 122a is disposed above the waveguide section 110 of the semiconductor layer, a second waveguide structure 122b is disposed above the first waveguide structure 122a, and a third waveguide structure 122c is disposed above the second waveguide structure 122c. Additionally, the vertically stacked waveguide structures 122a, 122b, and 122c are adjacent to the semiconductor detector 126. In particular, the end facets 136 of the waveguide structures 122a, 122b, and 122c are facing the front facet 142 of the semiconductor detector 126.

Although not shown by the illustrative figures, it should be understood that the configuration of placing additional waveguide structures above the embodiments depicted in FIGS. 1B to 1F are also contemplated within the scope of the present disclosure.

The vertically stacked waveguide structures 122a, 122b, and 122c may include semiconductor waveguide structures, dielectric waveguide structures, or a combination thereof. Exemplary semiconductor and dielectric materials for the waveguide structures are the same as those described in FIGS. 1A to 1F. In some embodiments, the vertically stacked waveguide structures include polycrystalline silicon waveguide structures, silicon nitride waveguide structures, or a combination thereof.

The waveguides structures 122a, 122b, and 122c in the vertical stack may have same or different geometries and sizes. For example, in the embodiment shown in FIG. 2A, the vertically stacked waveguide structures 122a, 122b, and 122c have substantially identical sizes.

FIG. 2A' illustrates an alternative embodiment of FIG. 2A, in accordance with the present disclosure. As shown in FIG. 2A', the vertically stacked waveguide structures 122a, 122b, and 122c preferably increases in size as they cascade towards the waveguide section 110 of the semiconductor layer 106.

It may be preferable for the additional waveguide structures to be vertically stacked. Advantageously, the vertical stacking of waveguide structures 122a, 122b, and 122c may provide a highly efficient transmission in which the change of optical mode may be negligible and the transmission efficiency across the waveguide structures 122a, 122b, and 122c and the waveguide section 110 of the semiconductor layer 106 may be near unity.

Also advantageously, by increasing the size of the vertically stacked waveguide structures 122a, 122b, and 122c as they cascade towards the waveguide section 110 of the semiconductor layer 106, it is found that such a configuration provides adiabatic coupling between the waveguide structures in the vertical stack with a short and compact footprint, high coupling efficiencies, low back reflections, low loss, and high fabrication-error tolerances.

The vertically stacked waveguide structures may be embedded in the cladding structure 124. As will be shown in subsequent drawings, the first 122a, second 122b and third 122c waveguide structures may be separated by cladding layers within the cladding structure 124.

As described herein, the dielectric layer 114 is disposed over the semiconductor detector 126. The dielectric layer 114 may extend above the waveguide section 110 of the semiconductor layer 106, as similarly shown in FIG. 1C. For example, in the embodiments shown in FIGS. 2A and 2A', the dielectric layer 114 extends to lie in between the waveguide section 110 of the semiconductor layer 106 and the vertically stacked waveguide structures 122a, 122b, and 122c.

Figure 2B:
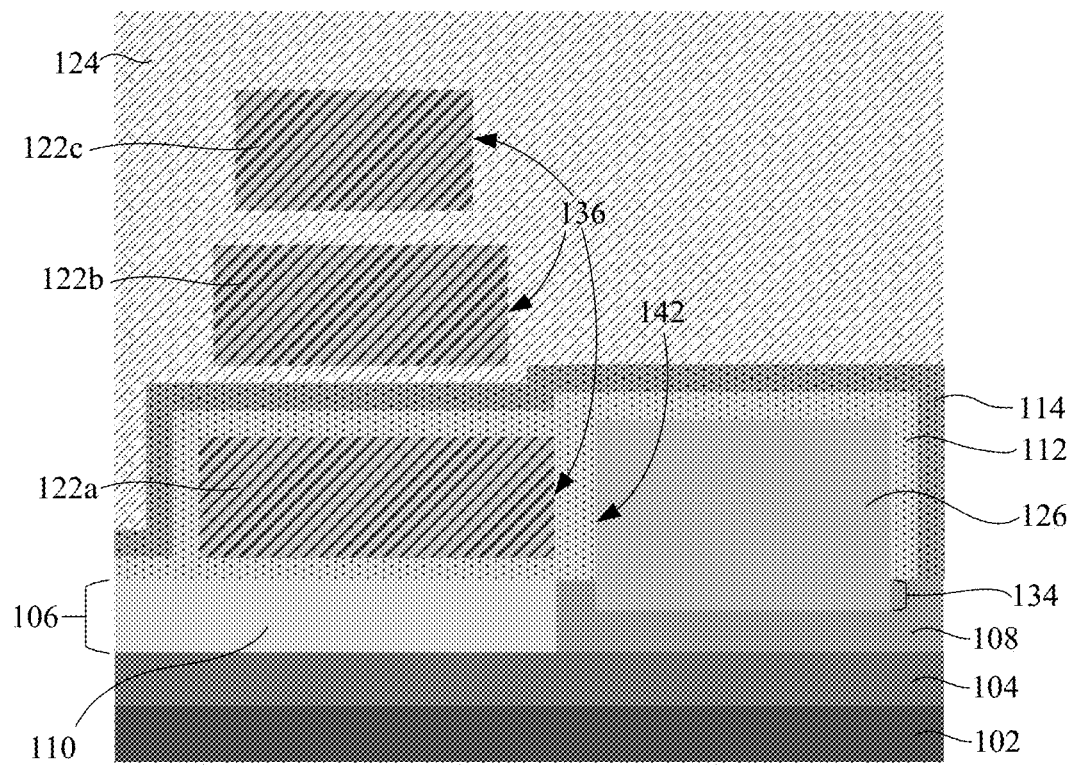
Figure 2B:
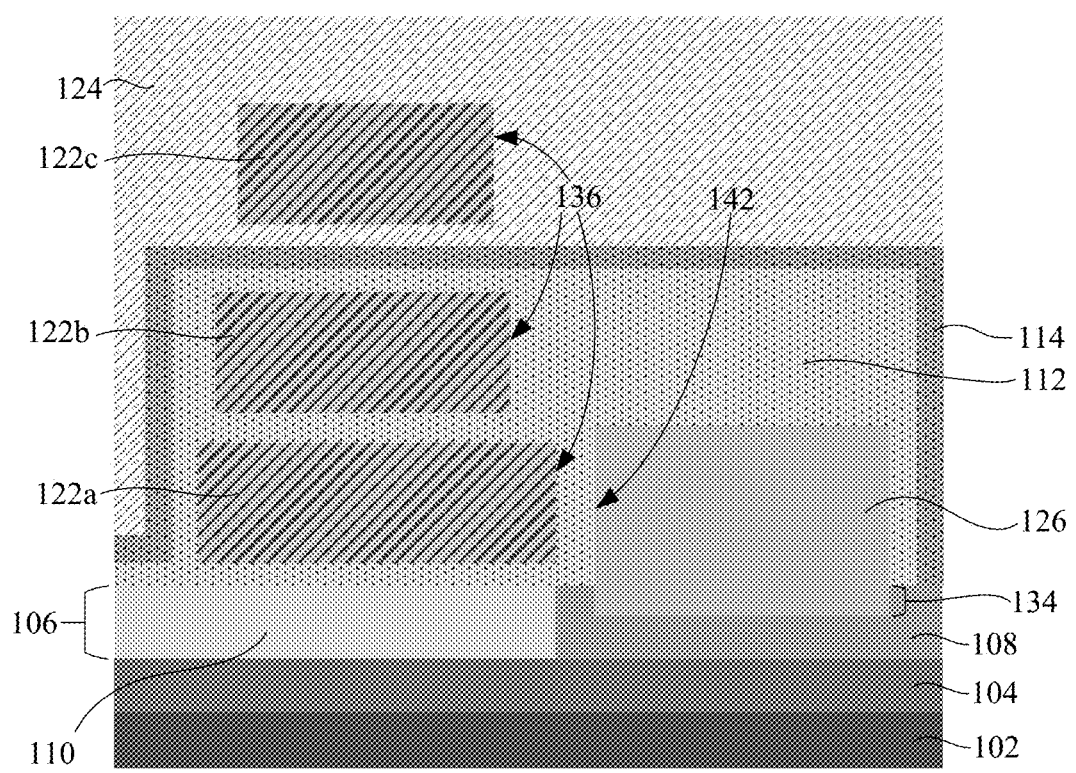

The dielectric layer 114 may also extend to lie in between a pair of waveguide structures in the vertical stack. For example, as shown in FIG. 2B, the dielectric layer 114 extends above the waveguide section 110 of the semiconductor layer 106 and in between the first waveguide structure 122a and the second waveguide structure 122b of the vertical stack. Alternatively, as shown in FIG. 2B', the dielectric layer 114 extends above the waveguide section 110 of the semiconductor layer 106 and in between the second waveguide structure 122*b* and the third waveguide structure 122*c* of the vertical stack.

Although FIGS. 2A, 2A', 2B, and 2B' illustrate three waveguide structures in the vertical stack, it should understood that other quantities of waveguides structures (such as two, four, five, six, etc.) in the vertical stack are also contemplated within the scope of the present disclosure.

FIGS. 3A to 3E and FIGS. 4A to 4D illustrate exemplary configurations of the semiconductor detector 126, the waveguide structure(s) 122, the waveguide section 110 and the active section 108 of the semiconductor layer 106. For clarity's sake, other device features, such as the dielectric layer, the dielectric liner, the cladding structure, the substrate, are not shown in FIGS. 3A to 3E and FIGS. 4A to 4D. Additionally, the waveguide structure(s) 122 is outlined as a rectangle in FIGS. 3A to 3E and FIGS. 4A to 4D so as not to obscure the illustration of the waveguide section 110 of the semiconductor layer 106 underneath the waveguide structure(s) 122.

As shown in FIGS. 3A to 3E, the waveguide structure 122 is optically coupled to the semiconductor detector 126 by having the end facet 136 of the waveguide structure 122 aligned with the front facet 142 of the adjacent semiconductor detector 126. This coupling configuration of the waveguide structure 122 and the semiconductor detector 126 may be referred to as a "butt-end coupling".

Figure 3A:
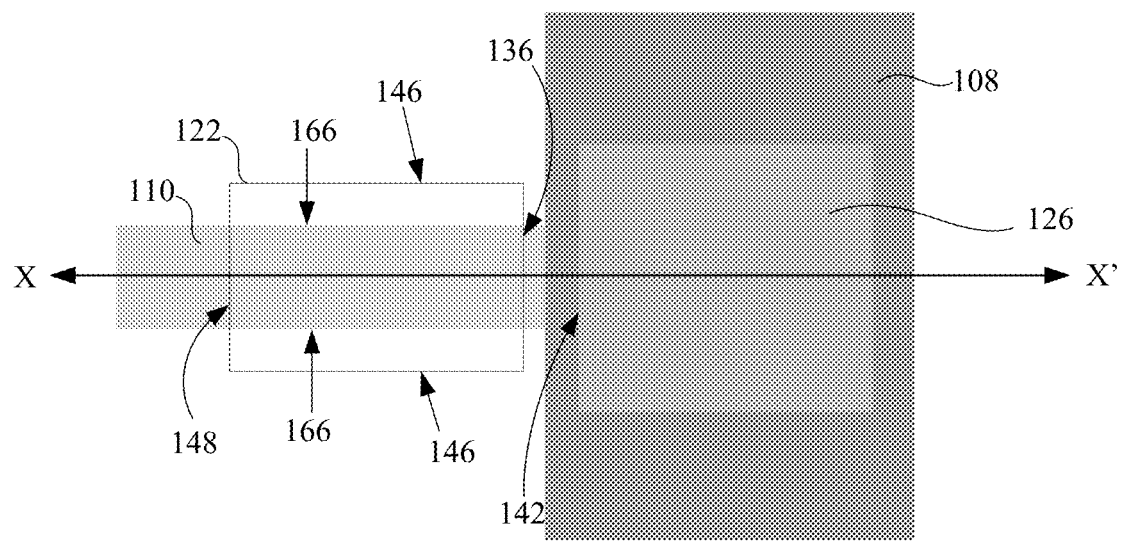
FIGS. 3A to 3E are plan views of the various exemplary layouts of the waveguide structure represented by FIG. 1A and the semiconductor detector, in accordance with the present disclosure. Line X-X' in FIGS. 3A to 3E indicates the section line for the cross-sectional view in FIG. 1A.

FIG. 3A depicts the waveguide structure 122 and the waveguide section 110 of the semiconductor layer 106 having side facets (146 and 166, respectively) that are substantially parallel to each other.

In some embodiments, it is preferable for the waveguide structure 122 and the waveguide section 110 of the semiconductor layer 106 to have tapered side facets. Tapered side facets are found to increase the coupling efficiency and reduce the back reflection of the waves in the butt-end coupling configuration as described above.

Figure 3B:
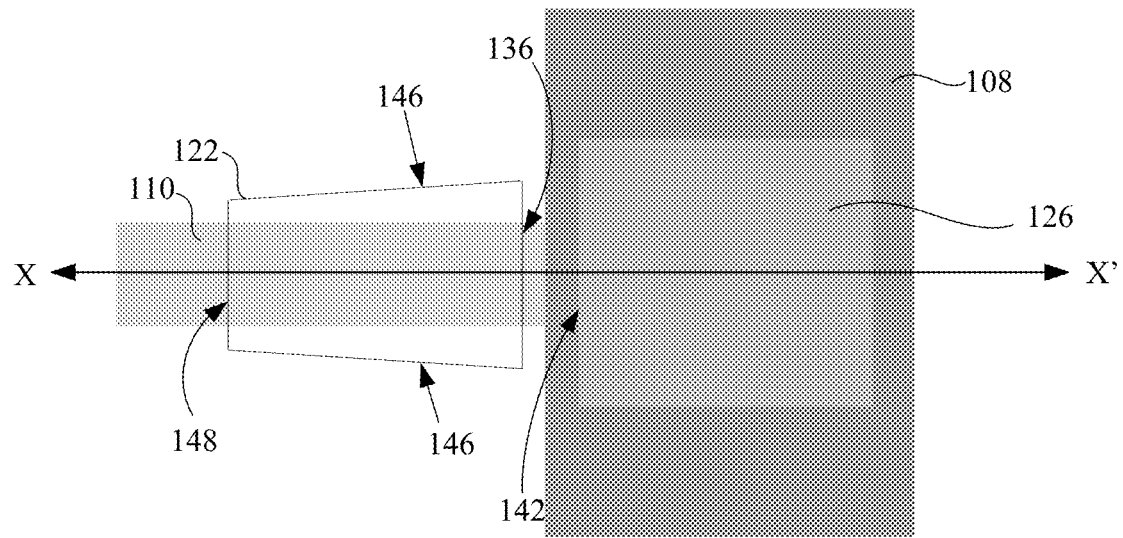

For example, as shown in FIG. 3B, the waveguide structure 122 has side facets 146 that taper away from each other as they meet the end facet 136 of the waveguide structure 122.

Figure 3C:
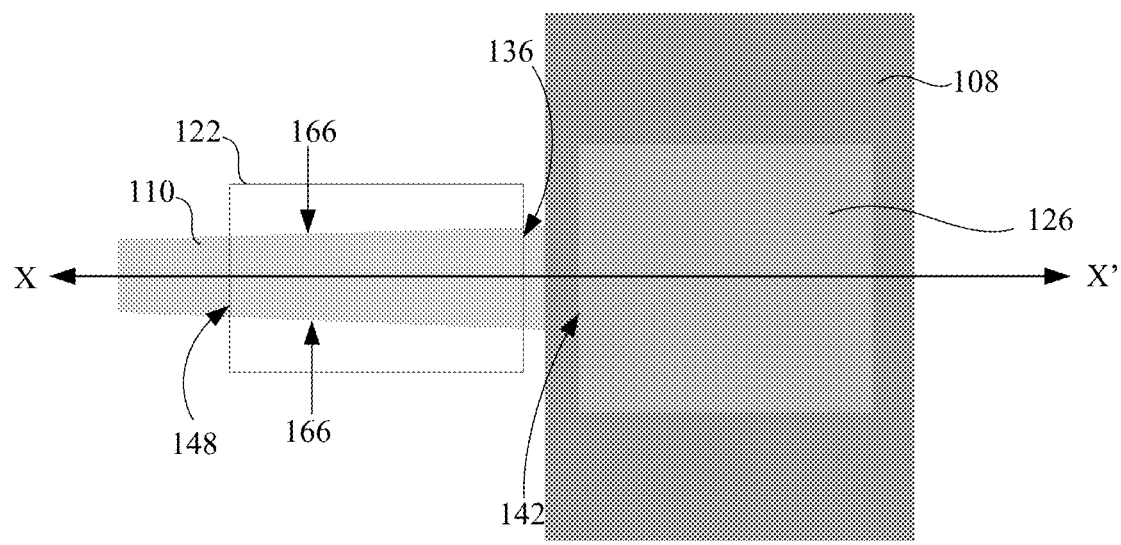

FIG. 3C illustrates the waveguide section 110 of the semiconductor layer 106 having side facets 166 that taper away from each other as they meet the adjoining active section 108 of the semiconductor layer 106. The side facets of the waveguide structure 122 remain substantially parallel to each other.

Figure 3D:
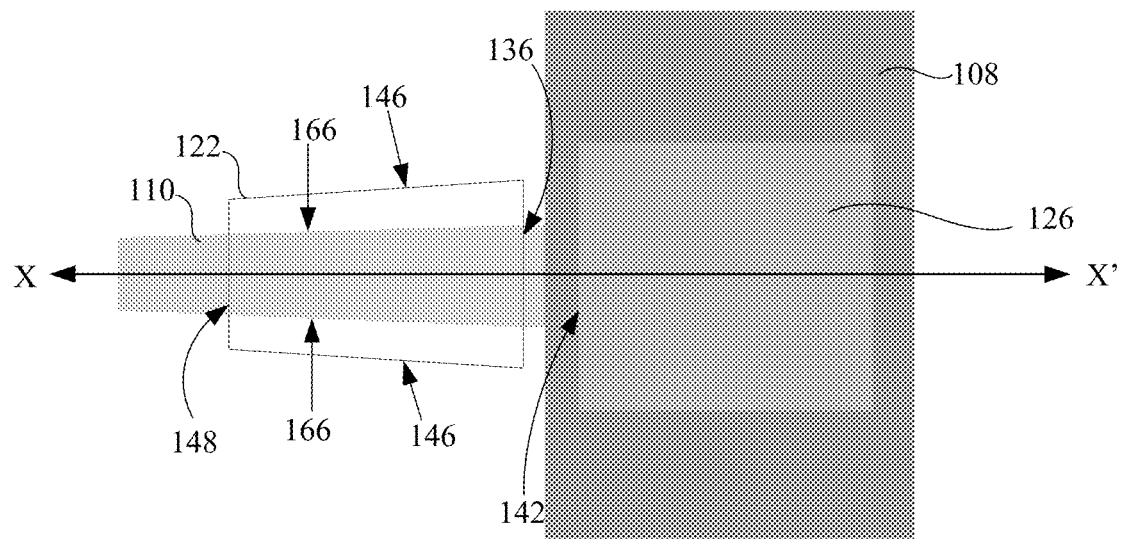

FIG. 3D illustrates another example in which both the waveguide structure 122 and the waveguide section 110 of the semiconductor layer 106 have tapered side facets (146 and 166, respectively) that are configured in the manner described in FIGS. 3B and 3C.

Figure 3E:
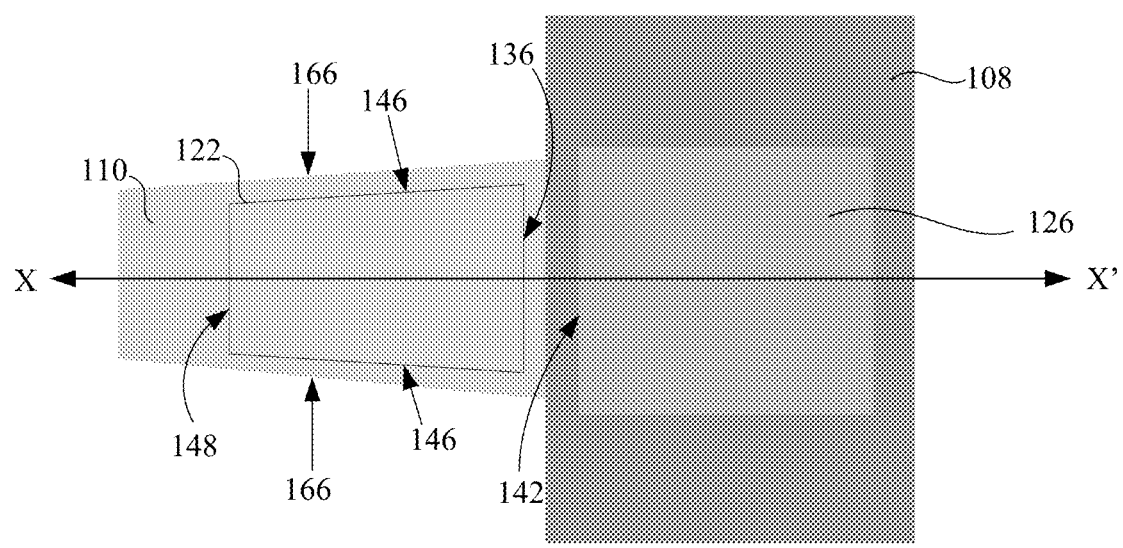

The waveguide section 110 of the semiconductor layer 106 may have a width larger than, smaller than, or equal to a width of the waveguide structure 122. The width of the waveguide section 110 and the width of the waveguide structure may be measured as the distance between the opposing side facets. For example, as illustrated in FIGS. 3A to 3D, the waveguide section 110 has a smaller width than that of the waveguide structure 122. Alternatively, as illustrated in FIG. 3E, the waveguide section 110 has a larger width than that of the waveguide structure 122.

Although FIGS. 3A to 3E are plan views of the embodiment shown in FIG. 1A, it should be understood that the exemplary layouts described in FIGS. 3A to 3E are contemplated as being applicable to the embodiments of FIGS. 1B to 1F and FIG. 2A.

Referring to FIGS. 4A to 4D, the waveguide structures 122*a*, 122*b*, and 122*c* may be configured to have different sizes where the vertically stacked waveguide structures 122*a*, 122*b*, and 122*c* increase in size as they cascade towards the waveguide section 110 of the semiconductor layer 106.

Figure 4A:
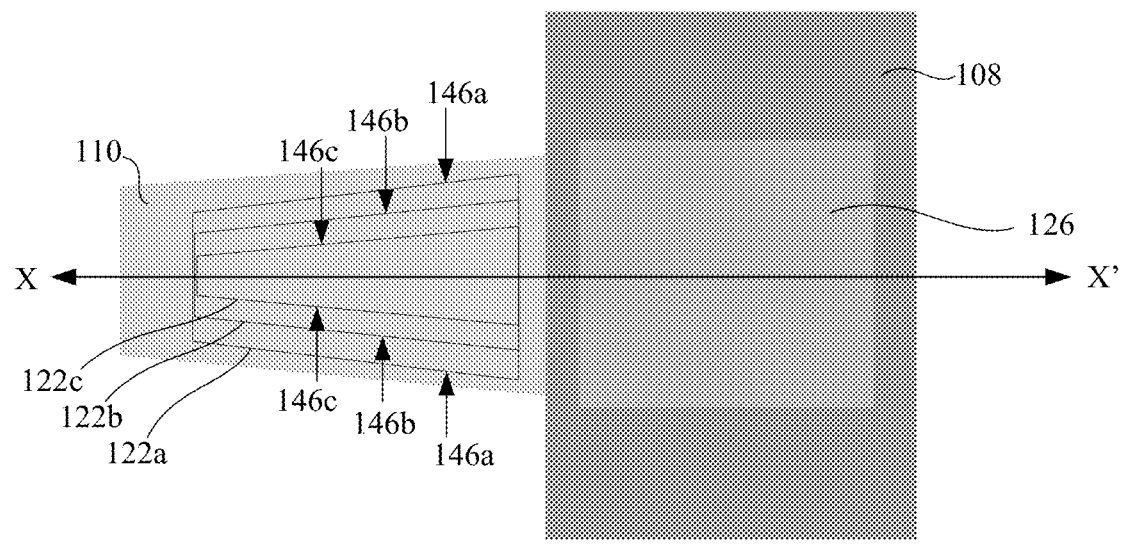
FIGS. 4A to 4D are plan views of the various exemplary layouts of the vertically stacked waveguide structures represented by FIG. 2A and the semiconductor detector, in accordance with the present disclosure. Line X-X' in FIGS. 4A to 4D indicates the section line for the cross-sectional view in FIG. 2A'.

For example, as shown in FIG. 4A, the first waveguide structure 122*a* has the largest width (i.e., distance between opposing side facets 146*a*), the second waveguide structure 122*b* having the medial width (i.e., distance between opposing side facets 146*b*) relative to the first 122*a* and third 122*c* waveguide structures, and the third waveguide structure 122*c* having the smallest width (i.e., distance between opposing side facets 146*c*).

Figure 4B:
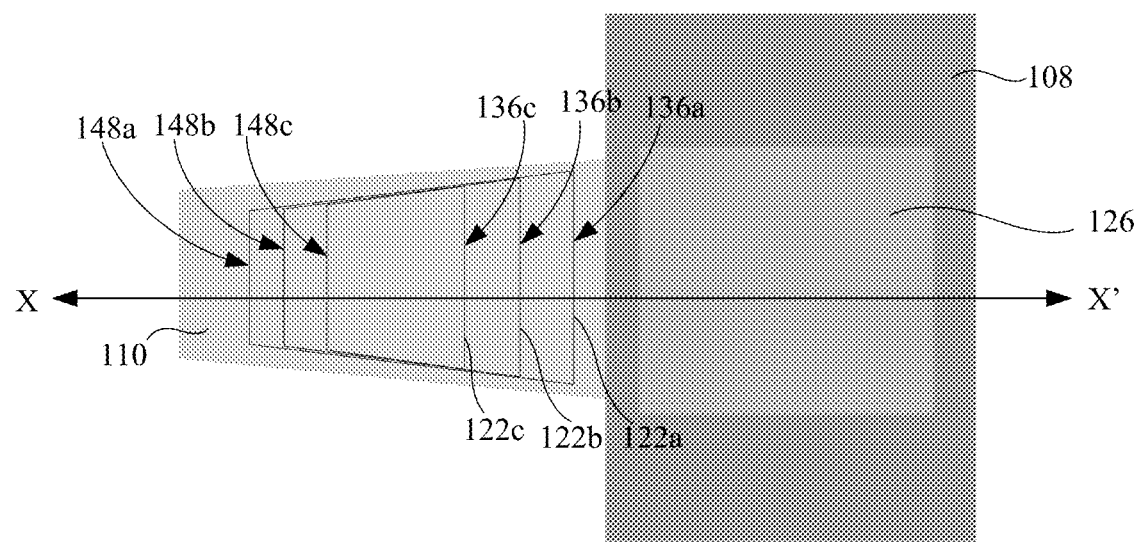

As another example, as shown in FIG. 4B, the first waveguide structure 122*a* has the largest length (i.e., distance between its front facet 148*a* and end facet 136*a*), the second waveguide structure 122*b* having the medial length (i.e., distance between its front facet 148*b* and end facet 136*b*) relative to the first 122*a* and third 122*c* waveguide structures, and the third waveguide structure 122*c* having the smallest length (i.e., distance between its front facet 148*c* and end facet 136*c*).

Figure 4C:
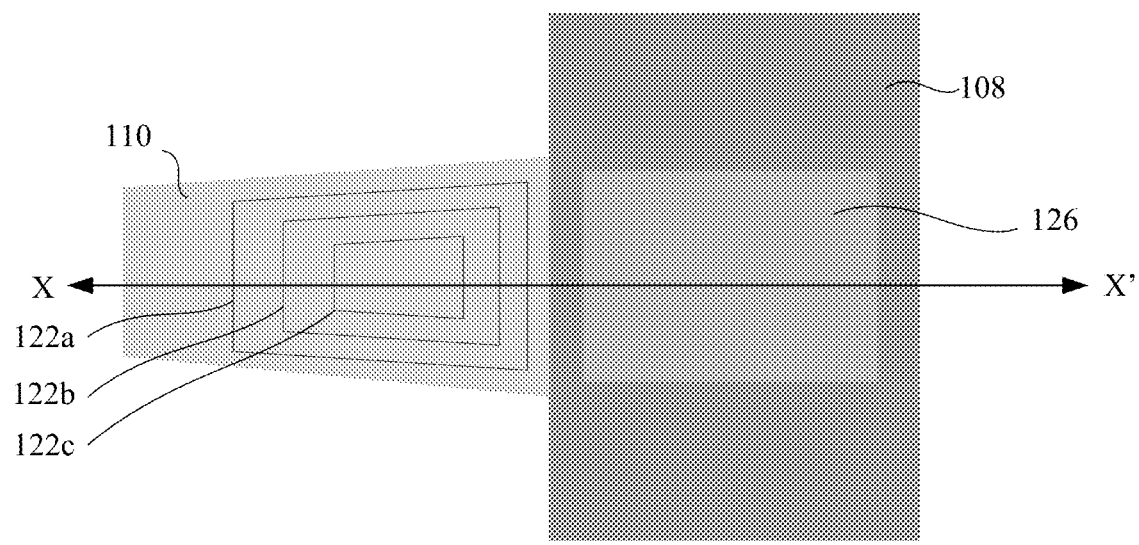

FIG. 4C illustrates another example in which the first 122*a*, second 122*b* and third 122*c* waveguide structures differ from each other in terms of their respective length and width dimensions. As shown, the vertically stacked waveguide structures 122*a*, 122*b*, and 122*c* have top surface areas that increase as they cascade from the third waveguide structure 122*c* to the first waveguide structure 122*a*.

Figure 4D:
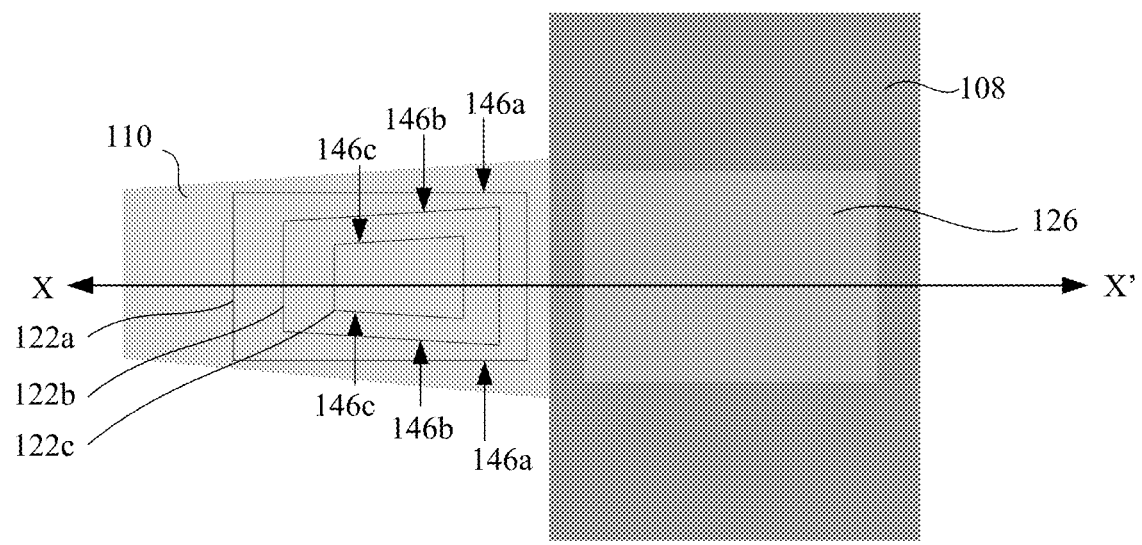

The vertically stacked waveguide structures 122*a*, 122*b*, and 122*c* may also be configured to have different geometries. In an embodiment, at least one waveguide structure has side facets that taper away from each other as they meet the end facets of the vertically stacked waveguide structures. For example, as shown in FIG. 4D, the first waveguide structure 122*a* have side facets 146*a* that are substantially parallel to each other while the second 122*a* and third 122*c* waveguide structures have tapered side facets (146*b* and 146*c*, respectively).

Although FIGS. 4A to 4D are plan views of the embodiment shown in FIG. 2A', it should be understood that the exemplary layouts described in FIGS. 4A to 4D are contemplated as being applicable to the embodiments of FIGS. 2B and 2B'.

Additionally, for simplicity, the illustrations in FIGS. 2A, 2A', 2B, and 2B' depict the waveguide section 110 having a larger width than the width of the waveguide structures 122*a*, 122*b*, and 122*c*. However, it should be understood that the embodiments shown in FIGS. 2A, 2A', 2B, and 2B' also contemplates configurations where the width of the waveguide section 110 of the semiconductor layer 106 is smaller than, or equal to the width of the first waveguide structure 122*a*.

A non-limiting description of the operation of the semiconductor device shall be described with reference to the accompanying drawings. Electromagnetic waves enter the waveguide section 110 of the semiconductor layer 106 and propagate into the waveguide structure 122 via the dielectric layer 114, as well as the adjoining active section 108 of the semiconductor layer 106.

Within the waveguide structure 122, electromagnetic waves traverse along a direction from the front facet 148 to the end facet 136 (e.g., along the horizontal axis) and towards the semiconductor detector 126. The electromagnetic waves exit the end facet 136 of the waveguide structure 122, passes through the dielectric layer 114, and then enter the front facet 142 of the semiconductor detector 126. Hence, the propagation of electromagnetic waves are confined internally along the waveguide structure 122 and the waveguide section 110 of the semiconductor layer 106, which enhances the optical coupling to the adjacent semiconductor detector 126 for both TE and TM input modes. Additionally, with the presence of the dielectric layer 114, it is found that the confinement of the guided mode (e.g., transverse-magnetic mode) in the waveguide structure 122 increases.

Advantageously, by adding the waveguide structure 122 above the waveguide section 110 of the semiconductor layer 106, it is found that the illumination and the intensity of electromagnetic waves incident on the semiconductor detector 126 is increased (e.g., incident on its front facet 142). Together with the "evanescent coupling" of the waveguide section 110 of the semiconductor layer 106 and the semiconductor detector 126, the present configuration also provides an improved effective index match between the waveguides and the semiconductor detector, which reduces energy loss and enhances coupling efficiency.

Figure 5A:
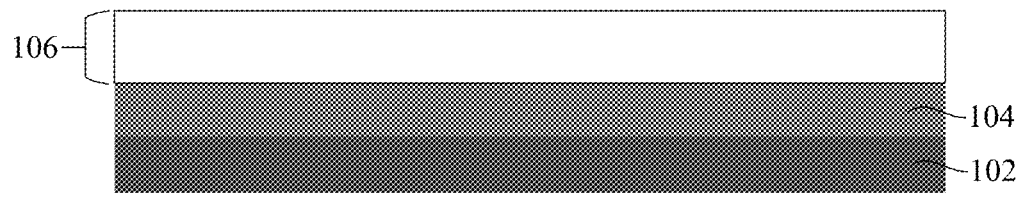
FIGS. 5A to 5G are cross-sectional views and illustrate an example of various processing stages for forming a semiconductor device, in accordance with embodiments of the present disclosure.

Referring to FIG. 5A, a cross-sectional view of a device structure for forming the semiconductor device of the present disclosure are shown. On a substrate 102, there is provided a buried insulator layer 104 and a semiconductor layer 106 formed on the buried insulator layer 104.

Figure 5B:
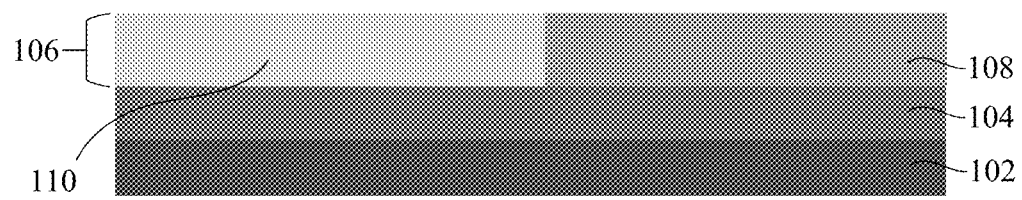

Referring to FIG. 5B (FIG. 5B continues from the embodiment shown in FIG. 5A), the semiconductor layer 106 is patterned to form the waveguide section 110 and the active section 108. The patterning of the semiconductor layer 106 may be performed using conventional masking and patterning techniques. The patterning may also form the waveguide section 110 with tapered side facets, as described herein. As used herein, "patterning techniques" includes deposition of material or photoresist, patterning, exposure, development, etching, cleaning, and/or removal of the material or photoresist as required in forming a described pattern, structure or opening. Examples of conventional techniques for patterning include, but not limited to, wet etch lithographic processes, dry etch lithographic processes or direct patterning processes.

Figure 5C:
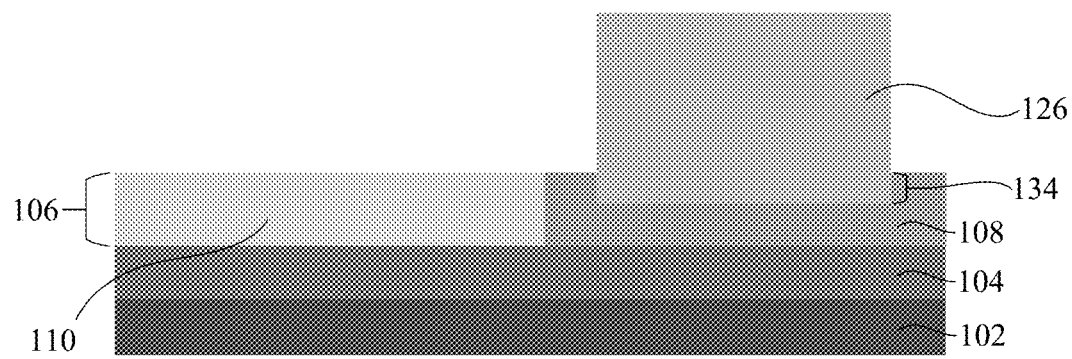

Referring to FIG. 5C (FIG. 5C continues from the embodiment shown in FIG. 5B), a semiconductor detector 126 is formed on the active section 108 of the semiconductor layer 106. In some embodiments, the active section 108 may be patterned using conventional patterning techniques to form a recessed portion 134 before forming the semiconductor detector 126. Alternatively, the semiconductor detector 126 is formed on a planar surface of the active section 108.

The formation of the semiconductor detector 126 may include the use of epitaxial growth (such as molecular beam epitaxy (MBE), liquid phase epitaxy, vapor phase epitaxy, or solid phase epitaxy), rapid melt growth, and/or deposition of a semiconductor material.

Figure 5D:
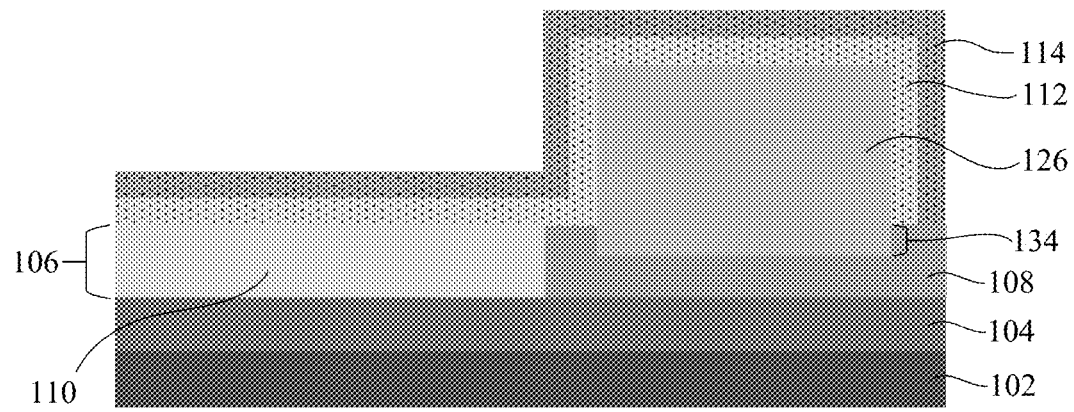

Referring to FIG. 5D, a dielectric liner 112 is formed on the semiconductor detector 126 and the waveguide section 110 of the semiconductor layer 106. Thereafter, a dielectric layer 114 is formed on the dielectric liner 112. Formation of the dielectric liner 112 and the dielectric layer 114 may be performed using conventional deposition techniques. The dielectric liner 112 may be formed during replacement metal gate processes in conventional semiconductor fabrication for integration with other device components in an IC (e.g., integration with a complementary metal oxide semiconductor (CMOS) device).

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD). In some embodiments, a conformal deposition process is preferred to deposit the dielectric liner 112 and the dielectric layer 114, e.g., an ALD process or a highly-controlled CVD process.

Although not shown in the accompanying drawings, in some embodiments, the dielectric layer 114 may be formed using deposition of multiple liners. For example, the dielectric layer 114 may include a first liner having a thickness in the range of about 10 nm to about 60 nm and a second liner having a thickness in the range of about 10 nm to about 16 nm. The first and second liners may be of the same dielectric material.

In an embodiment (not shown), the dielectric liner 112 and the dielectric layer 114 may be patterned such that the dielectric liner 112 and the dielectric layer 114 is disposed above the active section 108 of the semiconductor layer 106 only and the waveguide section 110 of the semiconductor layer 106 is exposed.

Figure 5E:
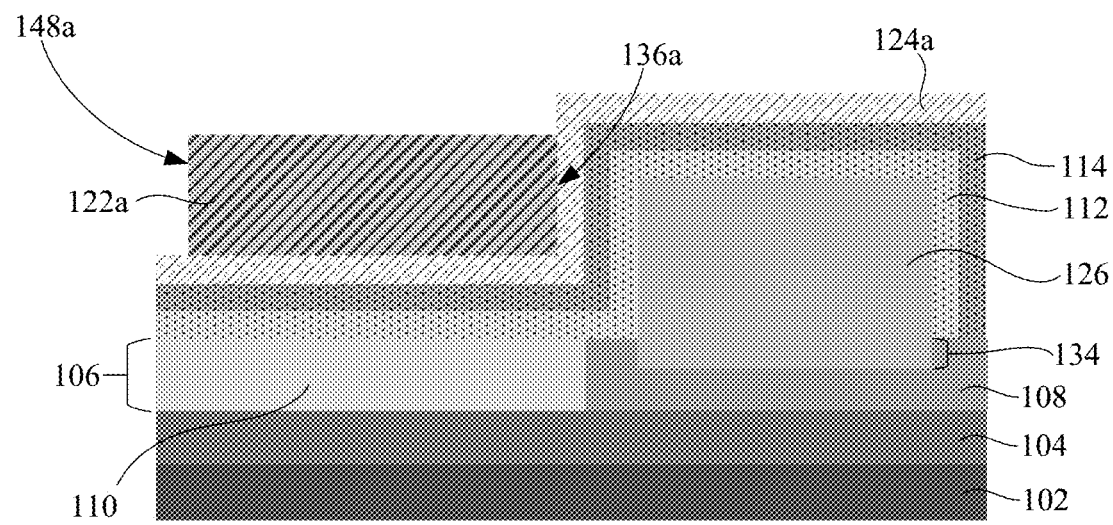

Referring to FIG. 5E, a first cladding layer 124a is formed on the dielectric layer 114, followed by forming a first waveguide structure 122a on the first cladding layer 124a. The first cladding layer 124a may be formed using conventional deposition techniques and may conform to the dielectric layer 114. The first waveguide structure 122a may be formed by depositing a semiconductor material layer or a dielectric material layer on the first cladding layer 124a, followed by patterning to form front facet 148a, end facet 136a and side facets thereof. As described herein, the side facets of the first waveguide structure 122a may be tapered.

In another embodiment (not shown), the first waveguide structure 122a may be formed directly on the dielectric layer 114 and then patterned such that the end facet 136a is directly adjacent to the dielectric layer 114. Thereafter, the first cladding layer 124a is deposited on the first waveguide structure 122a and the dielectric layer 114.

In yet another embodiment (not shown), the first waveguide structure 122a may be formed directly on the exposed waveguide section 106 of the semiconductor layer 106 followed by the deposition of the first cladding layer 124a.

Exemplary semiconductor devices described in FIGS. 1A to 1D and 1F may be formed at this stage of the process by depositing an additional cladding layer to cover the first waveguide structure 122a. The multiple cladding layers formed during the processing stages constitute the cladding structure 124 as described herein.

The semiconductor devices may also be subjected to further semiconductor processing for integration with other device components in an IC. Examples of further processing may include the formation of back-end-of-line (BEOL) structures such as redistribution layers, interlayer dielectric isolation structure and interconnect structures above the cladding structure 124. The BEOL structures may also provide protection for the semiconductor detector 126 and the waveguide structure 122.

Figure 5F:
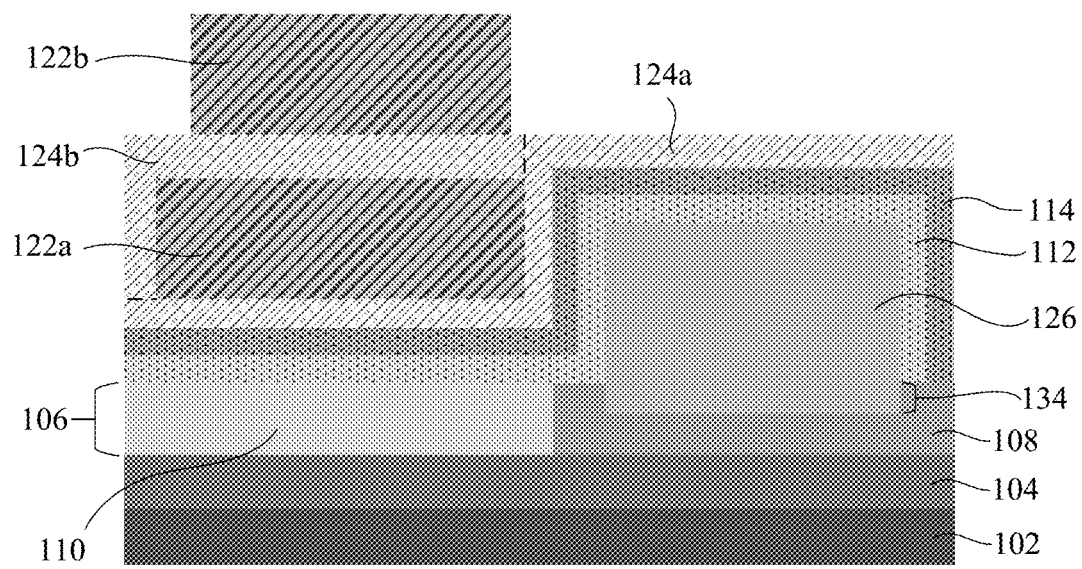

Referring to FIG. 5F (FIG. 5F continues from the embodiment shown in FIG. 5E), a second cladding layer 124b is formed to cover the first waveguide structure 122a. Thereafter, a second waveguide structure 122b is formed on the second cladding layer 124b. The formation of the second cladding layer 124b and the second waveguide structure 122b may be performed using the same deposition and patterning techniques described in FIG. 5E. An additional cladding layer may be deposited at this stage of the process to cover the second waveguide structure 122b, thereby forming another exemplary semiconductor device of the present disclosure.

Figure 5G:
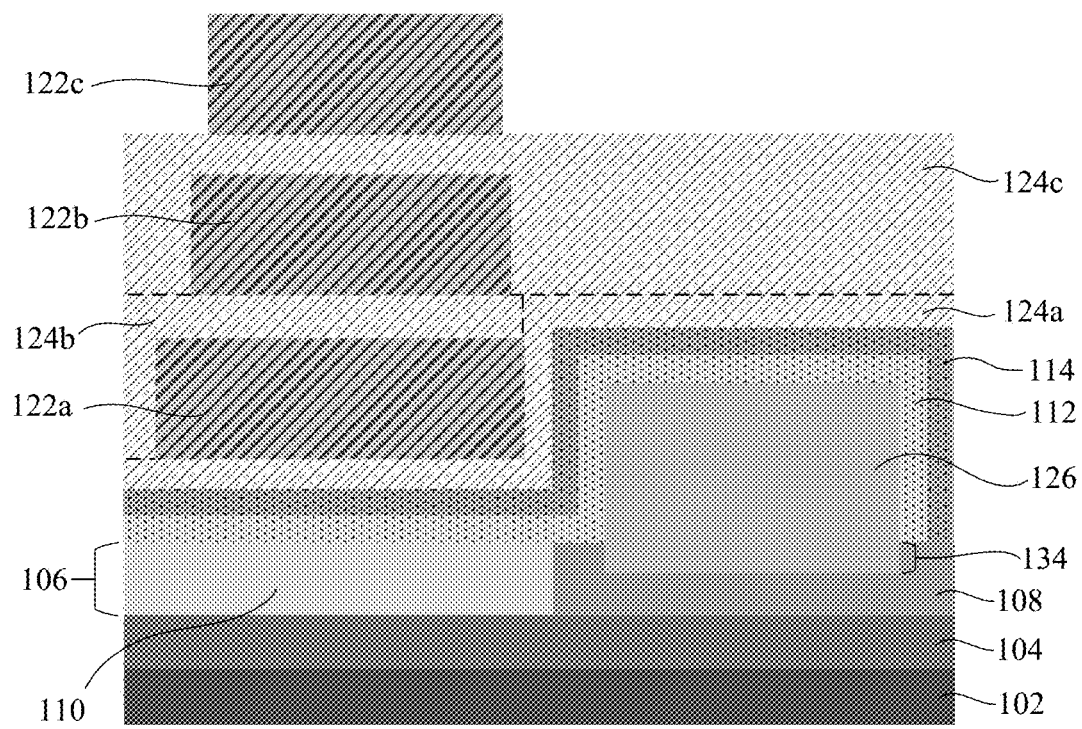
Figure 5D:
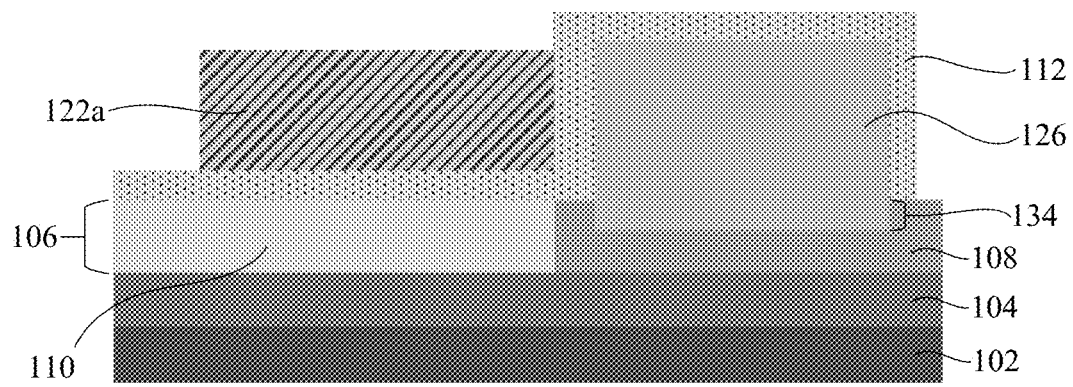
Figure 5E:
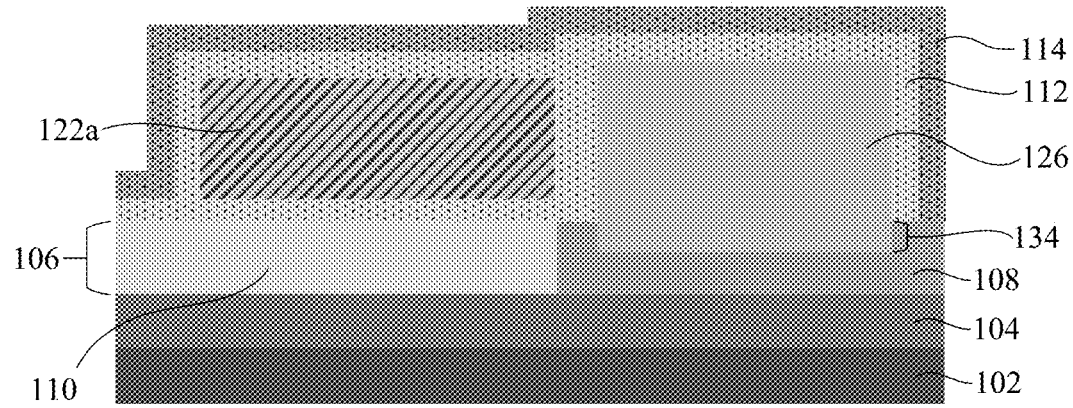
Figure 5F:
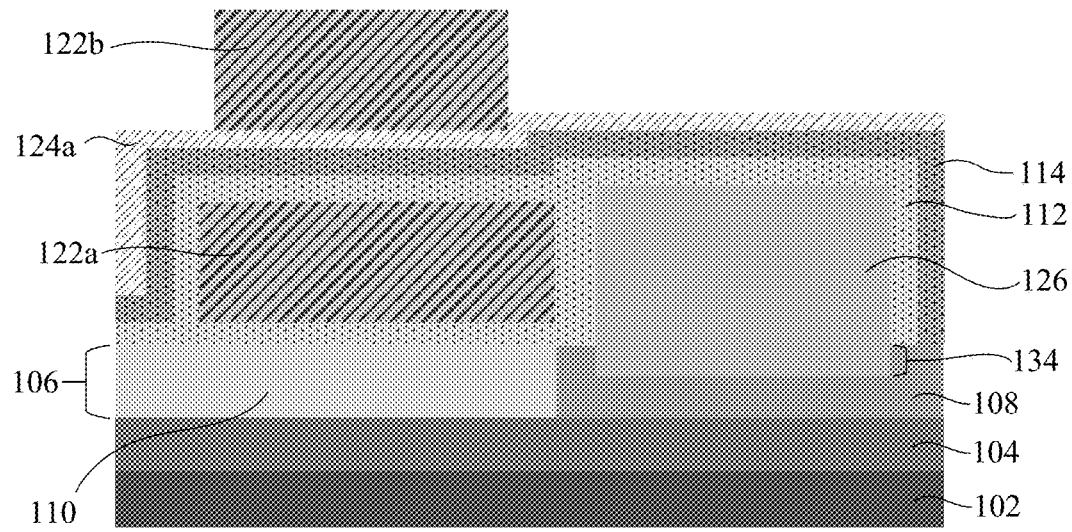
Figure 5G:
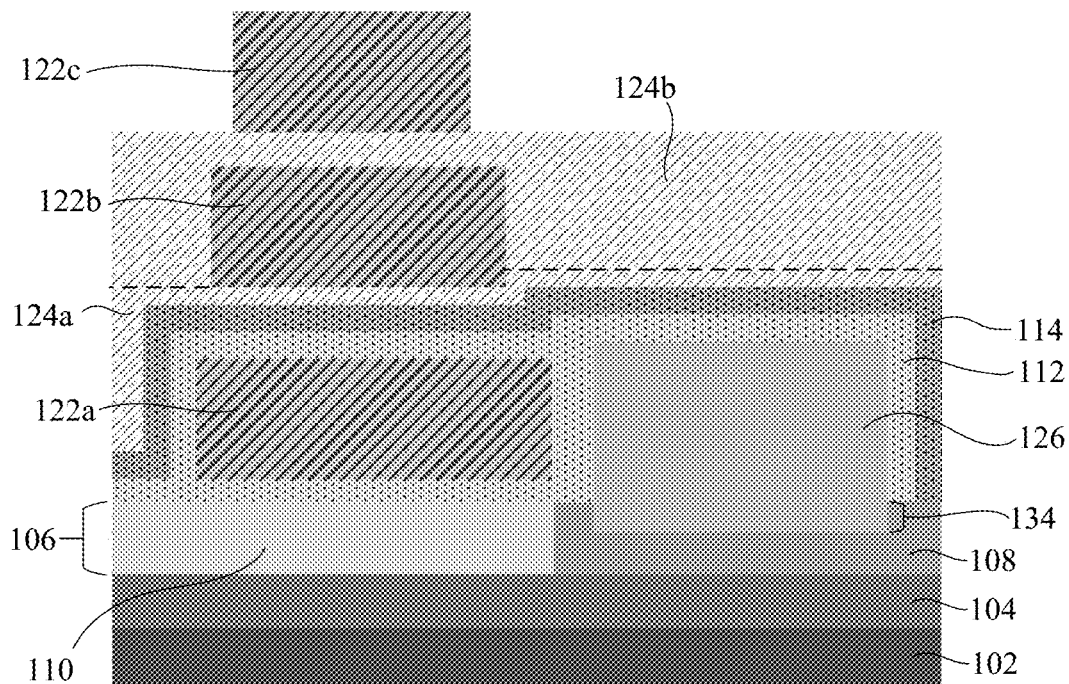

Referring to FIG. 5G (FIG. 5G continues from the embodiment shown in FIG. 5F), a third cladding layer 124c is formed to cover the second waveguide structure 122b. Thereafter, a third waveguide structure 122c is formed on the third cladding layer 124c. The formation of the second cladding layer 124b and the second waveguide structure 122b may be performed using the same deposition and patterning techniques described in FIG. 4E. The thicknesses of each waveguide structure 122a, 122b, and 122c may be controlled by the deposition process to form the same.

Exemplary semiconductor devices described in FIGS. 2A and 2A' may be formed at this stage of the process by depositing an additional cladding layer to cover the third waveguide structure 122c. The multiple cladding layers formed during the processing stages constitute the cladding structure 124 as described herein. Depending on the design requirements of the semiconductor devices, additional waveguide structures may be included in the device configuration by repeating the steps described in FIGS. 5E to 5G.

The semiconductor devices may also be subjected to further semiconductor processing for integration with other device components in an IC. Examples of further processing may include formation of back-end-of-line (BEOL) structures such as redistribution layers, interlayer dielectric isolation structures and interconnect structures above the cladding structure 124. The BEOL structures may also provide protection for the semiconductor detector 126 and the waveguide structures 122a, 122b, and 122c.

FIGS. 5D' to 5G' illustrate another exemplary process for forming the semiconductor device of the present disclosure. Referring to FIG. 5D' (FIG. 5D' continues from the embodiment shown in FIG. 5C), the dielectric liner 112 is formed on the semiconductor detector 126, the active section 108 and the waveguide section 110 of the semiconductor layer 106 using conventional deposition techniques. For example, the dielectric liner 112 is formed using a conformal deposition process, e.g., an ALD process or a highly-controlled CVD process. Thereafter, a first waveguide structure 122a is formed on the dielectric liner 112 using the same techniques as described in FIG. 5E.

Referring to FIG. 5E' (FIG. 5E' continues from the embodiment shown in FIG. 5D'), additional deposition of the dielectric liner 112 is performed to encapsulate the first waveguide structure 122a. Thereafter, a dielectric layer 114 is formed on the dielectric liner 112 using conventional deposition techniques. Additional deposition of cladding layers may be performed to form the exemplary semiconductor device shown in FIG. 1E.

Referring to FIGS. 5F' and 5G' (FIG. 5F' continues from the embodiment shown in FIG. 5E', and FIG. 5G' continues from the embodiment shown in FIG. 5F'), a plurality of waveguide structures vertically stacked above the waveguide section 110 of the semiconductor layer 106 is formed using the same techniques described in FIGS. 5F and 5G.

For example, as shown in FIG. 5F', a first cladding layer 124a is deposited on the dielectric layer 114 followed by the deposition of a second waveguide structure 122b. An additional cladding layer may be deposited to cover the second waveguide structure 122b at this stage of the process to form another exemplary semiconductor device of the present disclosure.

As shown in FIG. 5G', a second cladding layer 124b is deposited to cover the second waveguide structure 122b followed by the deposition of a third waveguide structure 122c. An additional cladding layer may be deposited to cover the embodiment shown in FIG. 5G' to form the exemplary semiconductor device shown in FIG. 2B.

Alternatively, although not shown in the accompanying drawings, the embodiment shown in FIG. 2B' may be formed by performing additional deposition of the dielectric liner 112 to encapsulate the first 122a and second 122b waveguide structures, the deposition of the dielectric layer 114 on the dielectric liner 112, and the formation of the third waveguide structure 122c and the cladding layers above the dielectric layer 114 thereafter.

The embodiment shown in FIG. 5G' may also be subjected to further semiconductor processing for integration with other device components in an IC. Examples of further processing may include formation of back-end-of-line (BEOL) structures such as redistribution layers, interlayer dielectric isolation structures and interconnect structures above the cladding structure 124.

Figure 6:
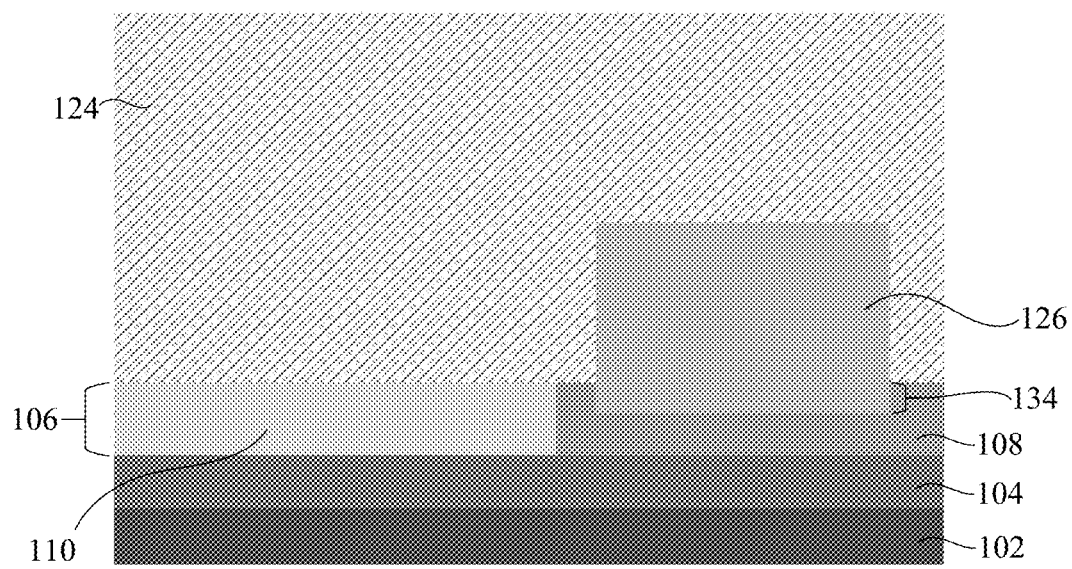
FIG. 6 is a cross-sectional view illustrating a semiconductor comparative test device without a waveguide structure.

Referring to FIG. 6, an example of a semiconductor comparative test device without a waveguide structure is shown. As shown, the semiconductor device has a substrate 102, a buried insulator layer 104 on the substrate 102, a semiconductor layer 106 on the buried insulator layer 104 and having a waveguide section 110 and an adjoining active section 108, a semiconductor detector 126 disposed on the active section 108, and a cladding structure 124 disposed on the semiconductor layer 106 and the semiconductor detector 126. The comparative test device also does not have a dielectric liner 112 and a dielectric layer 114.

A computer simulation study was conducted to compare the coupling efficiencies of the embodiments shown in FIG. 1A and FIG. 2A against that of the comparative test device shown in FIG. 6. The simulation was performed using software by Lumerical. The exemplary configurations of the semiconductor device were modelled using a Finite-difference time-domain (FDTD) method and the transmission of electromagnetic waves was simulated in both transverse-electric (TE) and transverse-magnetic (TM) modes.

For the purposes of the simulation study, the substrate 102 was simulated as a silicon substrate having a buried silicon dioxide layer 104. The semiconductor detector 126 was simulated as a germanium detector, the semiconductor layer 106 was simulated as a monocrystalline silicon layer, and the cladding structure 124 was simulated using silicon dioxide material.

Additionally, for the embodiments illustrated in FIG. 1A and FIG. 2A, the dielectric liner 112 was simulated as a silicon dioxide liner and the dielectric layer 114 was simulated as a silicon nitride layer. For FIG. 1A, the waveguide structure 122 was simulated using silicon nitride whereas for FIG. 2A, the vertically stacked waveguide structures 122a, 122b, and 122c were simulated using polycrystalline silicon. For both of the embodiments illustrated in FIG. 1A and FIG. 2A, the waveguide structures 122 had identical dimensions (e.g., thickness, length and width).

Based on the simulation study, the comparative example was found to have a modal effective index of 1.82 and a coupling efficiency of 66%. In contrast, the simulated embodiment using FIG. 1A was found to have a modal effective index of 2.02 and a coupling efficiency of 79%, while the simulated embodiment using FIG. 2A was found to have a modal effective index of 2.45 and a coupling efficiency of 93%.

Advantageously, it was found that the simulated embodiments of FIG. 1A and FIG. 2A had coupling efficiencies and modal effective indices that are higher than that of the comparative example of FIG. 6, and therefore provided improved modal overlap and increase confinement of the fundamental and/or higher-order TE and TM modes.

It should be noted that in addition to the fundamental modes used in the simulation study, higher-order modes may be excited by the input waveguides as well, depending on the geometries and dimensions of the device components. The improvement in the overall coupling efficiency may lead to enhanced performance of the semiconductor detector (e.g., a photodetector). For instance, the responsivity may be significantly improved owing to the optimized optical coupling and light absorption.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor devices and methods disclosed herein may be employed in manufacturing a variety of different integrated circuit products and modules, including, but not limited to, CMOS devices, optoelectronic modules, LIDAR instrumentation and LIDAR systems, etc.

What is claimed is:

1. A semiconductor device comprising:
a substrate;
a semiconductor layer having a waveguide section and an adjoining active section above the substrate;
a semiconductor detector disposed on the active section of the semiconductor layer, the semiconductor detector having a front facet;
a dielectric layer disposed over the semiconductor detector; and
a waveguide structure above the waveguide section of the semiconductor layer and adjacent to the semiconductor detector, the waveguide structure having an end facet that faces the front facet of the semiconductor detector;
wherein the dielectric layer is between the end facet of the waveguide structure and the front facet of the semiconductor detector.

2. The device of claim 1, further comprising the dielectric layer extending between the waveguide section of the semiconductor layer and the waveguide structure.

3. The device of claim 1, further comprising the waveguide structure having side facets that taper away from each other as they meet the end facet of the waveguide structure.

4. The device of claim 1, further comprising the waveguide section of the semiconductor layer has side facets that taper away from each other as they meet the active section of the semiconductor layer.

5. The device of claim 1, wherein the waveguide structure is a semiconductor material or a dielectric material.

6. The device of claim 1, wherein the waveguide structure is a first waveguide structure and further comprising a second waveguide structure vertically stacked above the first waveguide structure.

7. The device of claim 1, further comprising a cladding structure disposed above the waveguide structure and the dielectric layer.

8. A semiconductor device comprising:
a substrate;
a semiconductor layer having a waveguide section and an adjoining active section above the substrate;
a semiconductor detector disposed on the active section of the semiconductor layer;
a dielectric layer disposed over the semiconductor detector; and
a plurality of waveguide structures that are vertically stacked above the waveguide section of the semiconductor layer and adjacent to the semiconductor detector, wherein the dielectric layer extends above the waveguide section of the semiconductor layer and in between a pair of waveguide structures in the vertical stack.

9. The device of claim 8, wherein the vertically stacked waveguide structures further comprising semiconductor waveguide structures or dielectric waveguide structures, or a combination thereof.

10. The device of claim 8, wherein the vertically stacked waveguide structures increase in size as they cascade towards the waveguide section of the semiconductor layer.

11. The device of claim 8, wherein the semiconductor detector has a front facet that is facing end facets of the vertically stacked waveguide structures.

12. The device of claim 11, wherein the plurality of vertically stacked waveguide structures further comprising at least one waveguide structure having side facets that taper away from each other as they meet the end facets of the vertically stacked waveguide structures.

13. The device of claim 8, wherein the vertically stacked waveguide structures have substantially identical sizes.

14. The device of claim 7, wherein the waveguide structure is embedded within the cladding structure.

15. The device of claim 1, further comprising a dielectric liner disposed on the semiconductor detector and the dielectric layer being disposed on the dielectric liner, wherein the dielectric liner is between the end facet of the waveguide structure and the front facet of the semiconductor detector.

16. The device of claim 15, wherein the dielectric liner and the dielectric layer extend between the waveguide section of the semiconductor layer and the waveguide structure.

17. A semiconductor device comprising:
   a substrate;
   a semiconductor layer having a waveguide section and an adjoining active section above the substrate;
   a semiconductor detector disposed on the active section of the semiconductor layer;
   a dielectric layer disposed over the semiconductor detector; and
   a plurality of waveguide structures that are vertically stacked above the waveguide section of the semiconductor layer and adjacent to the semiconductor detector, wherein the dielectric layer extends to lie between the waveguide section of the semiconductor layer and the vertically stacked waveguide structures.

18. The device of claim 17, further comprising a cladding structure disposed above the dielectric layer, wherein the vertically stacked waveguide structures are embedded in the cladding structure and each waveguide structure is separated by cladding layers within the cladding structure.

19. The device of claim 18, wherein the vertically stacked waveguide structures increase in size as they cascade towards the waveguide section of the semiconductor layer.

20. The device of claim 19, wherein the semiconductor detector has a front facet that is facing end facets of the vertically stacked waveguide structures, and the plurality of vertically stacked waveguide structures further comprising at least one waveguide structure having side facets that taper away from each other as they meet the end facets of the vertically stacked waveguide structures.

* * * * *